US012635152B2

(12) United States Patent
Jeong et al.

(10) Patent No.: US 12,635,152 B2
(45) **Date of Patent: \*May 19, 2026**

(54) MANUFACTURING METHOD OF A SEMICONDUCTOR DEVICE HAVING HIGH-VOLTAGE ISOLATION CAPACITOR

(71) Applicant: SK keyfoundry Inc., Cheongju-si (KR)

(72) Inventors: Jong Yeul Jeong, Cheongju-si (KR);
Sang Geun Koo, Cheongju-si (KR);
Jeong Ho Sheen, Cheongju-si (KR);
Kang Sup Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 546 days.

This patent is subject to a terminal disclaimer.

(21) Appl. No.: 18/188,592

(22) Filed: Mar. 23, 2023

(65) Prior Publication Data

US 2024/0162282 A1 May 16, 2024

(30) Foreign Application Priority Data

Nov. 10, 2022 (KR) ........................ 10-2022-0149607

(51) Int. Cl.
*H10D 1/00* (2025.01)
*H10D 1/68* (2025.01)
*H10D 84/00* (2025.01)
(52) U.S. Cl.
CPC ............. *H10D 1/042* (2025.01); *H10D 1/716* (2025.01); *H10D 84/212* (2025.01)
(58) Field of Classification Search
CPC ...... H10D 1/042; H10D 1/716; H10D 84/212; H10D 1/692; H10D 1/68; H01L 23/5226; H01L 23/5283

USPC .......................................................... 438/381
See application file for complete search history.

(56) References Cited

U.S. PATENT DOCUMENTS

| | | | |
|---|---|---|---|
| 6,211,034 B1* | 4/2001 | Visokay | ............ H01L 21/32139 438/720 |
| 2003/0030084 A1* | 2/2003 | Moise | .................... H10D 1/682 257/295 |
| 2004/0251514 A1* | 12/2004 | Abadeer | ................ H10D 1/688 257/532 |

(Continued)

OTHER PUBLICATIONS

Korean Office Action Issued on Dec. 18, 2025, in Counterpart Korean Patent Application No. 10-2022-0149607 (5 Pages in English, 5 Pages in Korean).

*Primary Examiner* — Duy T Nguyen
(74) *Attorney, Agent, or Firm* — NSIP Law

(57) ABSTRACT

A method for manufacturing a semiconductor device includes providing a high-voltage isolation capacitor region on a substrate, forming a bottom electrode in the high-voltage isolation capacitor region, forming an inter-metal dielectric layer on the bottom electrode, forming a low bandgap dielectric layer on the inter-metal dielectric layer, forming a first hard mask layer on the low bandgap dielectric layer, patterning the first hard mask layer and the low bandgap dielectric layer to form a patterned first hard mask layer and a patterned low bandgap dielectric layer, depositing a thick metal film on the patterned first hard mask layer and the patterned low bandgap dielectric layer, and patterning the thick metal film to form a top electrode in the high-voltage isolation capacitor region, such that the top electrode overlaps the patterned first hard mask layer and the patterned low bandgap dielectric layer.

16 Claims, 8 Drawing Sheets

(56)　　　　　References Cited

U.S. PATENT DOCUMENTS

| | | | |
|---|---|---|---|
| 2012/0187536 | A1 | 7/2012 | Dunn et al. |
| 2015/0333055 | A1 | 11/2015 | West et al. |
| 2016/0163785 | A1 | 6/2016 | West et al. |
| 2016/0172434 | A1* | 6/2016 | West .................... H10D 84/038 |
| | | | 438/396 |
| 2017/0263696 | A1 | 9/2017 | West et al. |
| 2019/0074350 | A1 | 3/2019 | West et al. |
| 2020/0312794 | A1 | 10/2020 | West et al. |
| 2022/0208956 | A1 | 6/2022 | West |
| 2023/0154974 | A1* | 5/2023 | Stewart ............ H01L 23/49575 |
| | | | 257/532 |

* cited by examiner

MANUFACTURING METHOD OF A SEMICONDUCTOR DEVICE HAVING HIGH-VOLTAGE ISOLATION CAPACITOR

CROSS-REFERENCE TO RELATED APPLICATIONS

This application is based on and claims the benefit under 35 U.S.C. 119(a) of Korean Patent Application No. 10-2022-0149607, filed on Nov. 10, 2022 in the Korean Intellectual Property Office, the entire disclosure of which is incorporated herein by reference for all purposes.

BACKGROUND

1. Field

The following description relates to manufacturing method for a semiconductor device having a high-voltage isolation capacitor.

2. Description of Related Art

Digital Isolators electrically separate circuits but still allow for digital signals to be transferred between them, and support high-voltage isolation ratings up to 5 kV. Digital isolators use transformers or capacitors to magnetically or capacitively couple data across an isolation barrier. Capacitive isolation employs high-voltage isolation capacitors to couple data signals across the isolation barrier. A thick oxide interlayer insulating film as the isolation barrier is incorporated into the high-voltage isolation capacitors in a semiconductor device to obtain the high voltage isolation. However, it is hard to increase the high-voltage isolation by merely increasing a thickness of the thick oxide interlayer insulating film. To increase the high-voltage isolation, low bandgap materials having a bandgap lower than the thick oxide interlayer insulating film are recently incorporated into the high-voltage isolation capacitors.

Employing the lower bandgap materials may induce undesired leakage current in a mixed analog-digital circuit region of the semiconductor device. Integration process with the high-voltage isolation capacitors is required to reduce the leakage current in the mixed analog-digital circuit region.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a method for manufacturing a semiconductor device is provided. The method includes providing a high-voltage isolation capacitor region on a substrate, forming a bottom electrode in the high-voltage isolation capacitor region, forming an inter-metal dielectric layer on the bottom electrode, forming a low bandgap dielectric layer on the inter-metal dielectric layer, forming a first hard mask layer on the low bandgap dielectric layer, patterning the first hard mask layer and the low bandgap dielectric layer to form a patterned first hard mask layer and a patterned low bandgap dielectric layer, depositing a thick metal film on the patterned first hard mask layer and the patterned low bandgap dielectric layer, and patterning the thick metal film to form a top electrode in the high-voltage isolation capacitor region, wherein the top electrode overlaps the patterned first hard mask layer and the patterned low bandgap dielectric layer.

The method may further include forming a second hard mask layer on the thick metal film, and patterning the second hard mask layer to form a patterned second hard mask layer on the top electrode.

The method may further include forming a passivation layer on the patterned low bandgap dielectric layer and the top electrode, such that the passivation layer is in direct contact with the patterned low bandgap dielectric layer and the top electrode.

The patterned low bandgap dielectric layer may include a first portion overlapping the top electrode and having a first thickness, and a second portion not overlapping the top electrode and having a second thickness smaller than the first thickness.

The forming of the low bandgap dielectric layer on the inter-metal dielectric layer may include forming a first sub-low bandgap dielectric layer having a first thickness on the inter-metal dielectric layer, and forming a second sub-low bandgap dielectric layer having a second thickness greater than the first thickness on the first sub-low bandgap dielectric layer.

The low bandgap dielectric layer may include a first sub-low bandgap dielectric layer on the inter-metal dielectric layer, and a second sub-low bandgap dielectric layer on the first sub-low bandgap dielectric layer.

The second sub-low bandgap dielectric layer may include a first portion overlapping the top electrode, and a second portion not overlapping the top electrode and having a thickness smaller than a thickness of the first portion.

In another general aspect, a method for manufacturing a semiconductor device is provided. The method includes providing a high-voltage isolation capacitor region on a substrate, forming a bottom electrode in the high-voltage isolation capacitor region, forming an inter-metal dielectric layer on the bottom electrode, forming a low bandgap dielectric layer on the inter-metal dielectric layer, forming a first hard mask layer on the low bandgap dielectric layer, and forming a top electrode overlapping the bottom electrode, wherein the top electrode overlaps the first hard mask layer and the low bandgap dielectric layer.

The method may further include forming a second hard mask layer on the top electrode, and forming a passivation layer on the second hard mask layer, wherein the passivation layer is in direct contact with the low bandgap dielectric layer and the top electrode.

The method may further include providing a mixed-signal integrated circuit region on the substrate, forming an inter-metal line and a top via in the mixed-signal integrated circuit region, and forming a top metal line connected to the top via, wherein the low bandgap dielectric layer is not disposed below the top metal line.

The method may further include wherein the low bandgap dielectric layer includes a first sub-low bandgap dielectric layer having a first thickness, and a second sub-low bandgap dielectric layer having a second thickness greater than the first thickness.

The method may further include wherein the second sub-low bandgap dielectric layer includes a first portion overlapping the top electrode, and a second portion not overlapping the top electrode and having a thickness smaller than a thickness of the first portion.

The method may further include forming a spacer insulating layer on the first hard mask layer, and performing an etch-back process on the spacer insulating layer to form spacers on sidewalls of the low bandgap dielectric layer.

The method may further include wherein the top electrode has a bottom surface located higher than a bottom surface of the top metal line.

The method may further include wherein the low bandgap insulating layer has a bandgap lower than a bandgap of the inter-metal dielectric layer, and wherein the first hard mask layer comprises a metal nitride layer.

In another general aspect, a method for manufacturing a semiconductor device is provided. The method includes providing a mixed-signal integrated circuit region and a high-voltage isolation capacitor region, respectively, on a substrate, forming a bottom electrode in the high-voltage isolation capacitor region, forming an inter-metal dielectric layer on the bottom electrode, forming an inter-metal line and a top via in the mixed-signal integrated circuit region, forming a low bandgap dielectric layer on the inter-metal dielectric layer, forming a first hard mask layer on the low bandgap dielectric layer, patterning the first hard mask layer and the low bandgap dielectric layer to form a patterned first hard mask layer and a patterned low bandgap dielectric layer, depositing a thick metal film on the top via, the patterned first hard mask layer, and the patterned low bandgap dielectric layer, patterning the thick metal film to form a top electrode in the high-voltage isolation capacitor region and a top metal line connected to the top via in the mixed-signal integrated circuit region, and forming a passivation layer on the top metal line, the patterned low bandgap dielectric layer, and the top electrode, wherein the top electrode overlaps the patterned first hard mask layer and the patterned low bandgap dielectric layer, and wherein the low bandgap dielectric layer is not disposed below the top metal line.

Other features and aspects will be apparent from the following detailed description, the drawings, and the claims.

BRIEF DESCRIPTION OF DRAWINGS

FIG. 1 illustrates providing a semiconductor device according to one or more embodiments;

FIG. 2 illustrates a process for performing a first etching on the first hard mask layer according to one or more embodiments;

FIG. 3 illustrates a process for performing a second etching on the second sub-low bandgap dielectric layer according to one or more embodiments;

FIG. 4 illustrates a process for depositing a spacer insulating layer according to one or more embodiments;

FIG. 5 illustrates an etch-back process on the spacer insulating layer and first sub-low bandgap dielectric layer according to one or more embodiments;

FIG. 6 illustrates a process for forming a thick metal film according to one or more embodiments;

FIG. 7 illustrates a metal etching process to form a top metal line and a top electrode according to one or more embodiments; and FIG. 8 illustrates a process for depositing a passivation layer on the metal line and the top electrode according to one or more embodiments.

Figure 1:
FIGS. 1 to 8 illustrate process diagrams for understanding manufacturing process of a semiconductor device having a high-voltage isolation capacitor in accordance with one or more examples of the present disclosure.
Figure 1:
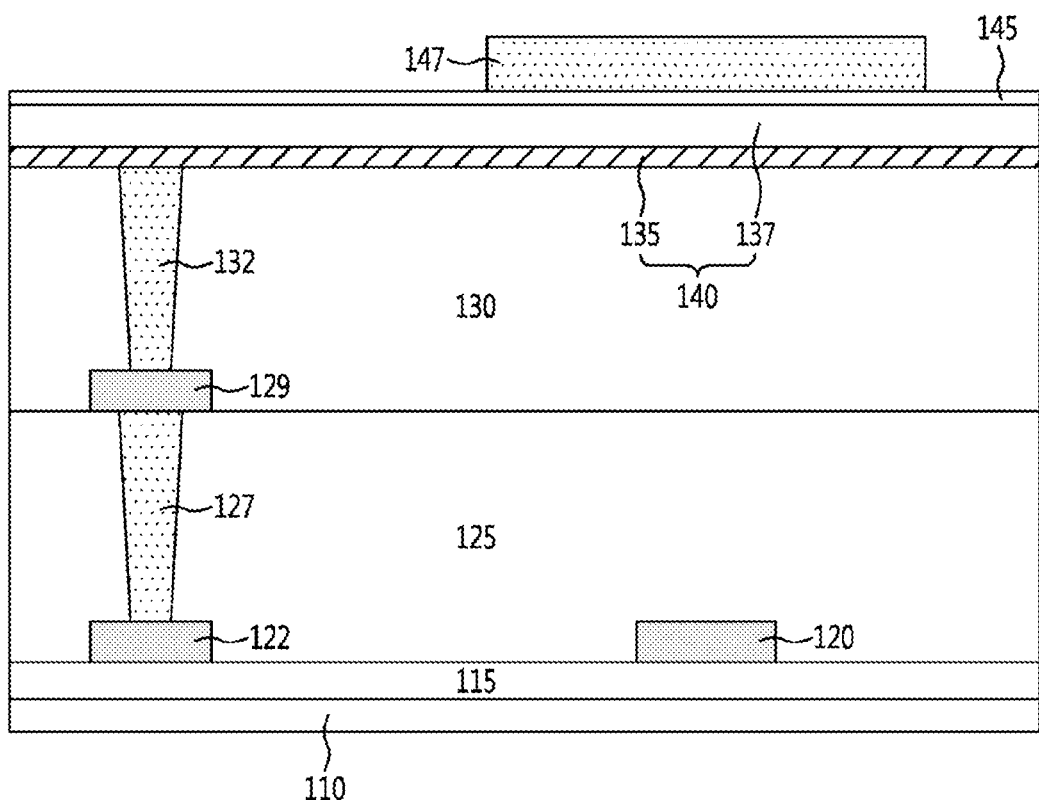

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Advantages and features of the present disclosure and methods of achieving the advantages and features will be clear with reference to embodiments described in detail below together with the accompanying drawings. However, the present disclosure is not limited to the embodiments disclosed herein but will be implemented in various forms. The embodiments of the present disclosure are provided so that the present disclosure is adequately disclosed, and a person with ordinary skill in the art can fully understand the scope of the present disclosure. Meanwhile, the terms used in the present specification are for explaining the embodiments, not for limiting the present disclosure.

Terms, such as first, second, A, B, (a), (b) or the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As implemented herein, the term "and/or" includes any one and any combination of any two or more of the associated listed items.

Although terms such as "first," "second," and "third" may be implemented herein to describe various members, components, regions, layers, or sections, these members, components, regions, layers, or sections are not to be limited by these terms. Rather, these terms are only implemented to distinguish one member, component, region, layer, or section from another member, component, region, layer, or section. Thus, a first member, component, region, layer, or section referred to in examples described herein may also be referred to as a second member, component, region, layer, or section without desurfaceing from the teachings of the examples.

Spatially relative terms such as "above," "upper," "below," and "lower" may be implemented herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms implemented herein are to be interpreted accordingly.

The terminology implemented herein is for describing various examples only, and is not to be implemented to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1 to 8 illustrate manufacturing method of a semiconductor device having a high-voltage isolation capacitor in accordance with one or more examples of the present disclosure.

FIG. 1 illustrates providing a semiconductor device according to one or more embodiments.

Referring to FIG. 1, the semiconductor device 100 may include a mixed-signal integrated circuit region 101 and a high-voltage isolation capacitor region 102. A mixed-signal integrated circuit is any integrated circuit that has both analog circuits and digital circuits on a single semiconductor die. The mixed-signal integrated circuit region 101 may have the mixed-signal integrated circuit or a digital signal processing circuit. The high-voltage isolation capacitor region 102 may have a capacitive isolation or a high-voltage isolation capacitor. The high-voltage isolation capacitor region 102 is designed to have a structure capable of a high-voltage isolation.

Referring to FIG. 1, a first inter-metal dielectric layer 115 is formed on a substrate 110. A bottom metal line 122 and a bottom electrode 120 are simultaneously formed in the first inter-metal dielectric layer 115 in a same step. The first inter-metal dielectric layer 115 may comprise $SiO_2$, tetraethyl orthosilicate (TEOS), undoped silicon glass (USG) or borophosphosilicate glass (BPSG). The bottom metal line 122 and the bottom electrode 120 exist on the same plane. The bottom electrode 120 and the bottom-metal lines 122 may each comprise Cu, Al, W, Ti, TiN, W, WN, Ta, or TaN, etc.

Subsequently, a second inter-metal dielectric layer 125 may be formed on the bottom electrode 120 and the bottom metal line 122. The second inter-metal dielectric layer 125 may comprise $SiO_2$, fluorosilicate glass (FSG), TEOS, USG, high-density plasma (HDP), spin-on-glass (SOG) or BPSG. The second inter-metal dielectric layer 125 may also comprise low-k materials such as SiOC.

A first via 127 is formed to connect to the bottom metal line 122, wherein the first via 127 is formed in the second inter-metal dielectric layer 125. The first via 127 may comprise a tungsten (W) or copper (Cu), etc. The first via 127 may be formed by etching the second inter-metal dielectric layer 125, depositing a material such as W or Cu, and then performing a chemical mechanical planarization (CMP) process on the second inter-metal dielectric layer 125 and W or Cu.

The inter-metal line 129 is formed to be connected to the first via 127. The inter-metal line 129 may comprise Cu, Al, W, Ti, TiN, W, WN, Ta, or TaN, etc.

A third inter-metal dielectric layer 130 is formed on the inter-metal line 129. The third inter-metal dielectric layer 130 may comprise $SiO_2$, FSG, TEOS, USG, HDP, SOG or BPSG. The second inter-metal dielectric layer 125 may also comprise low-k materials such as SiOC.

A second via 132 is formed to connect to the inter-metal line 129, wherein the second via 132 is formed in the third inter-metal dielectric layer 130. The second via 132 may be formed by etching the third inter-metal dielectric layer 130, depositing a material such as tungsten (A/), and performing a CMP process on the third inter-metal dielectric layer 130 and W or Cu. A top surface of the third inter-metal dielectric layer 130 may be flat by performing the CMP process. In other words, the top surfaces of the second via 132 and the third inter-metal dielectric layer 130 are flat or coplanar with each other. The top surface of the second via 132 and the bottom surface of the low bandgap dielectric layer 140 may have the same plane. The first via 127 and the second via 132 are together electrically connected to the bottom metal line 122 and the inter-metal line 129.

Continuing to refer to FIG. 1, a low bandgap dielectric layer 140 is formed on the second via 132 and the third inter-metal dielectric layer 130. The low bandgap dielectric layer 140 is deposited to a thickness ranging from 200 nm to 2,000 nm. In an example, the low bandgap dielectric layer 140 may have a bandgap in the range of 2.8 eV to 6 eV. The silicon dioxide has a bandgap of 9 eV. Therefore, the low bandgap dielectric layer 140 may have a bandgap lower than that of silicon dioxide.

The low bandgap dielectric layer 140 may be a single layer or multi-layers. Hereinafter, for example, the low bandgap dielectric layer 140 will be described as a double layer comprising a first sub-low bandgap dielectric layer 135 and a second sub-low bandgap dielectric layer 137. In this case, the first sub-low bandgap dielectric layer 135 may have a thickness different from that of the second sub-low bandgap dielectric layer 137. For example, as illustrated in FIG. 1, a thickness of the first sub-low bandgap dielectric layer 135 may be smaller than a thickness of the second sub-low bandgap dielectric layer 137.

Then, a first hard mask layer 145 may be formed on the low bandgap dielectric layer 140. The first hard mask layer 145 may protect an upper portion of the low bandgap dielectric layer 140 in a subsequent etching process. Thus, in the process of manufacturing a semiconductor device including the high-voltage isolation capacitor, the first hard mask layer 145 may prevent loss of the low bandgap dielectric layer 140.

In an example, the first hard mask layer 145 may comprise metal layers or metal nitride layers. The metal nitride layers may include titanium (Ti), titanium nitride (TiN), tungsten nitride (WN), tantalum nitride (TaN), etc. Among the metal nitride layers, the titanium nitride (TiN) layer may be implemented as the first hard mask layer 145 since the TiN layer has excellent bonding properties with a top metal line that will be deposited later. Then, a photo resist pattern 147 is formed on the first hard mask 145.

Figure 2:
Figure 2:
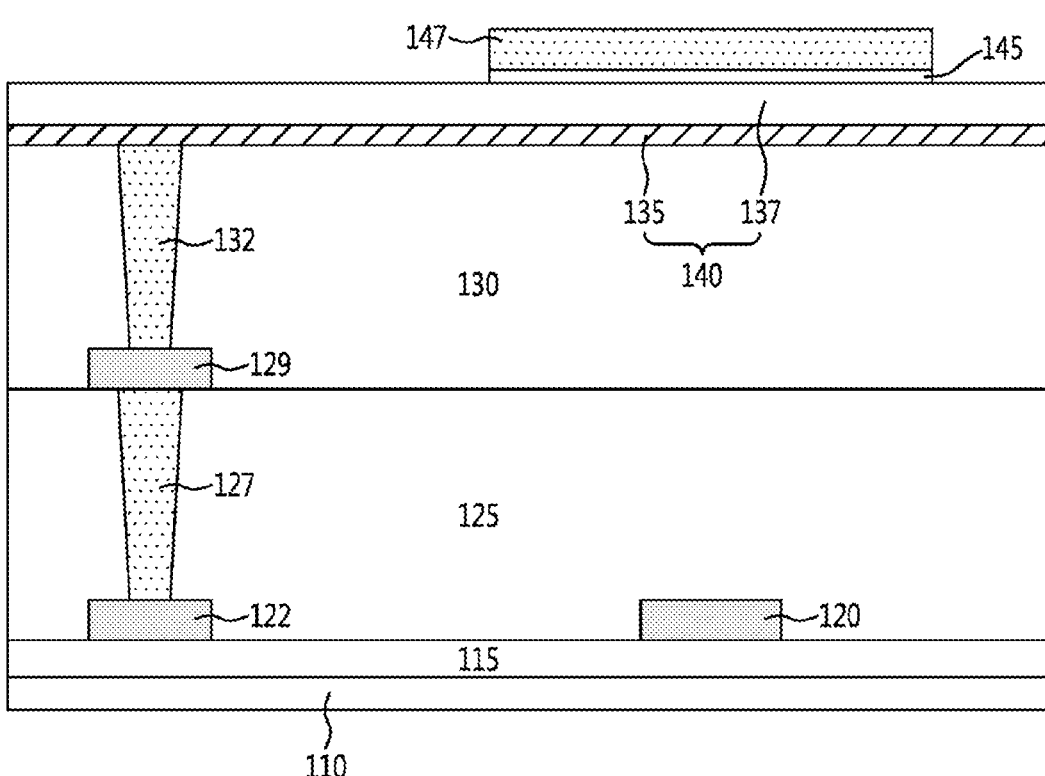

FIG. 2 illustrates a process for performing a first etching on the first hard mask layer according to one or more embodiments. Referring to FIG. 2, a first etching process on the first hard mask layer 145 is performed using the photo resist pattern 147 as a mask to form a patterned first hard mask layer 145. A top surface of the second sub-low bandgap dielectric layer 137 may be exposed after performing the first etching process.

Figure 3:
Figure 3:
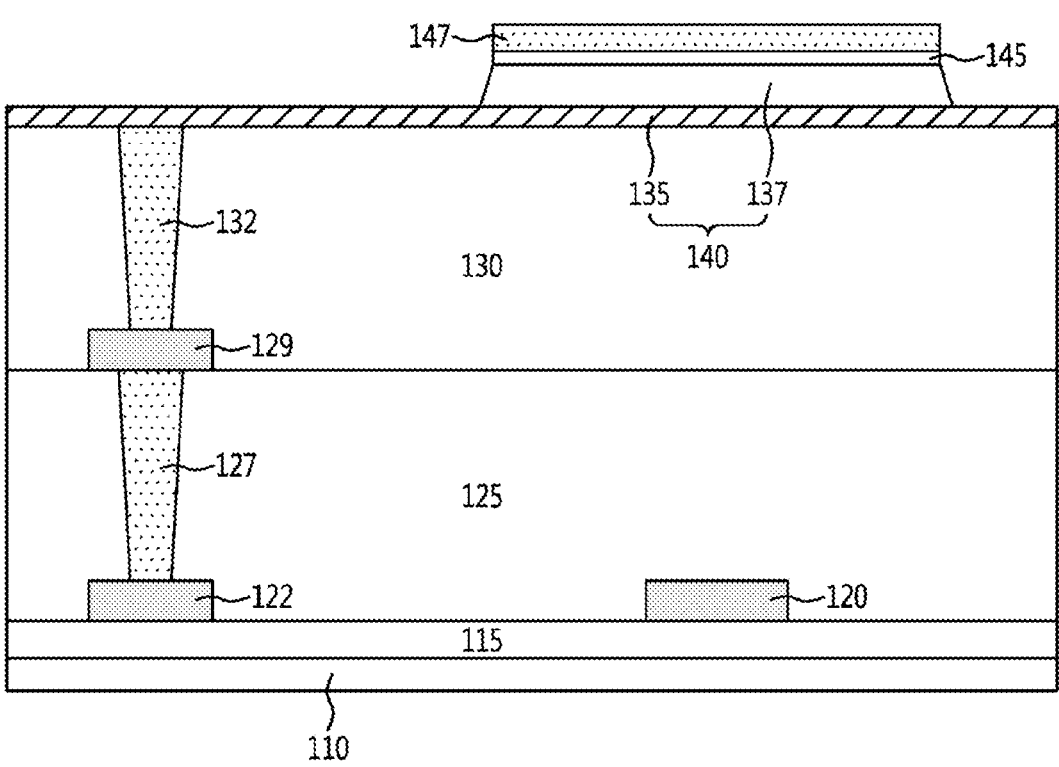

FIG. 3 illustrates a process for performing a second etching on the second sub-low bandgap dielectric layer according to one or more embodiments. Referring to FIG. 3, a second etching process on the second sub-low bandgap dielectric layer 137 is performed using the photo resist pattern 147 as a mask to form a patterned second sub-low bandgap dielectric layer 137. A top surface of the first sub-low bandgap dielectric layer 135 may be exposed after performing the second etching process.

Figure 4:
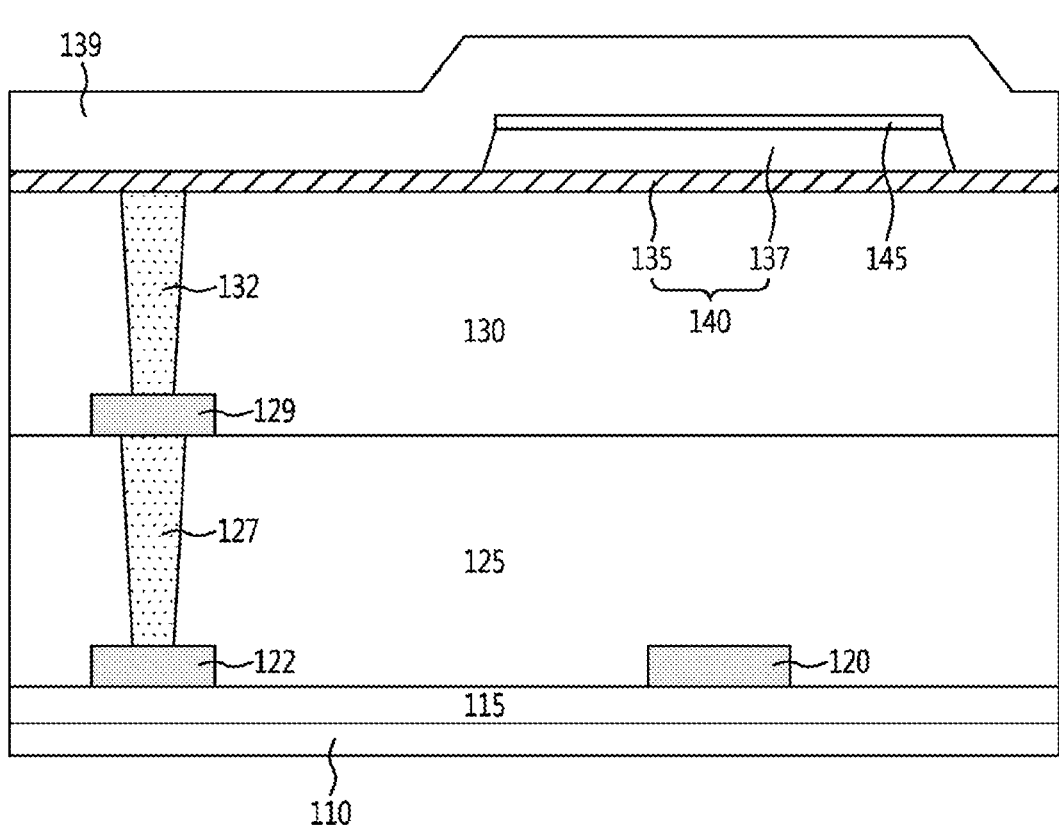

FIG. 4 illustrates a process for depositing a spacer insulating layer in accordance with one or more embodiments.

As illustrated in FIG. 4, the spacer insulating layer 139 may be deposited on the patterned low bandgap dielectric layer 140 and the patterned first hard mask layer 145. The spacer insulating layer 139 may comprise a material such as $SiO_2$, SiOC, a low-k material, USG, HDP, SiN, SiOCN, or SiOx (where x is less than 2).

Figure 5:
Figure 5:
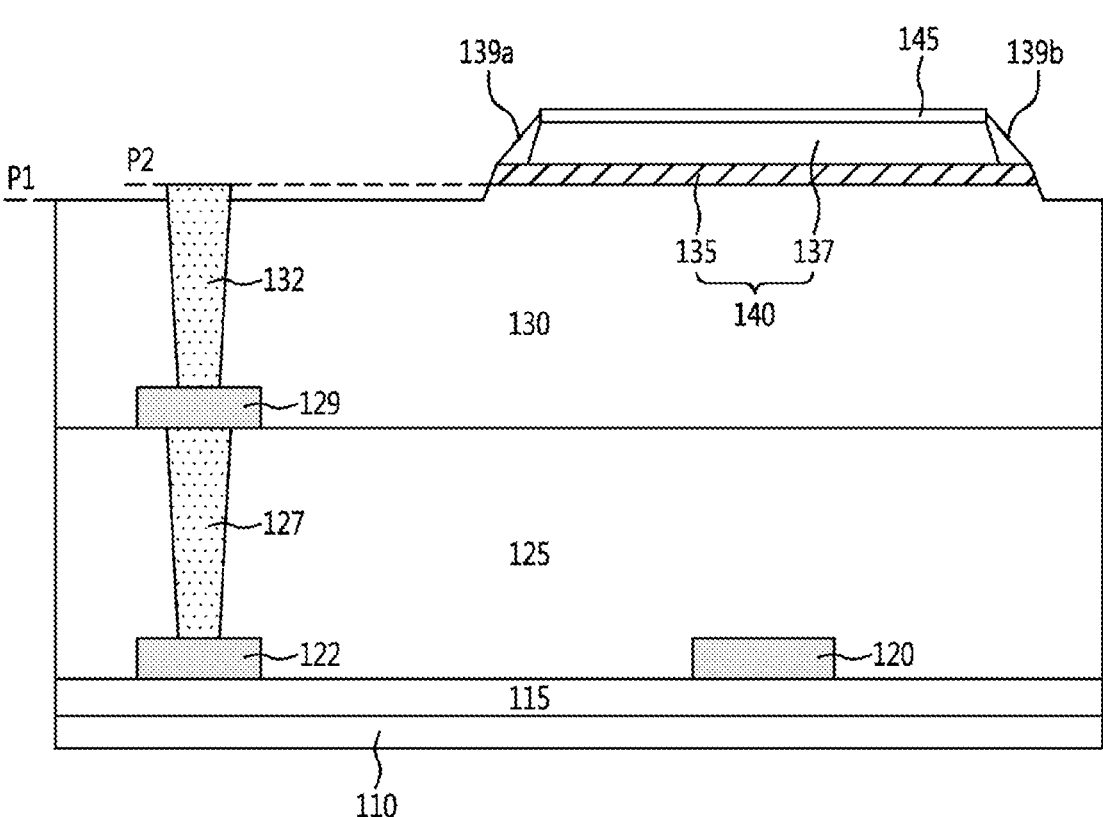

FIG. 5 illustrates an etch-back process on the spacer insulating layer and first sub-low bandgap dielectric layer in accordance with one or more embodiments.

Referring to FIG. 5, an etch-back process on the spacer insulating layer 139 and first sub-low bandgap dielectric layer 135 is performed. By performing the etch-back process, the spacer insulating layer 139 may be converted to spacers 139a and 139b formed on both sides of the patterned second sub-low bandgap dielectric layer 137. The spacers 139a and 139b may be also formed on both sides of the patterned hard mask layer 145. The spacers 139a and 139b may protect side surfaces of the patterned second sub-low bandgap dielectric layer 137 and the patterned first hard mask layer 145.

By performing the etch-back process, a first sub-low bandgap dielectric layer 135 may be converted to a patterned first sub-low bandgap dielectric layer 135. The patterned first sub-low bandgap dielectric layer 135 may be disposed under the second sub-low bandgap dielectric layer 137 and the spacers 139a and 139b.

By performing the etch-back process, top surfaces of the top via 132 and the third inter-metal dielectric layer 130 may be exposed. A portion of the third inter-metal dielectric layer 130 may be more etched than the top via 132 by the etch-back process. As a result, a top surface P1 of the third inter-metal dielectric layer 130 may be lower than a top surface P2 of the exposed top via 132. Therefore, a height difference between the upper surfaces P1 and P2 may occur.

As illustrated in FIG. 5, after the etch-back process, the patterned low bandgap dielectric layer 140, the patterned first hard mask layer 145 and the spacers 139a and 139b may remain in the high-voltage isolation capacitor region 102. The patterned low bandgap dielectric layer 140, the patterned first hard mask layer 145 and the spacers 139a and 139b may overlap the bottom metal electrode 120. However, the patterned first hard mask layer 145 and the spacers 139a and 139b may be removed from the mixed-signal integrated circuit region 101. Accordingly, the patterned low bandgap dielectric layer 140, the patterned first hard mask layer 145, and the spacers 139a and 139b do not exist in the mixed-signal integrated circuit region 101.

Figure 6:
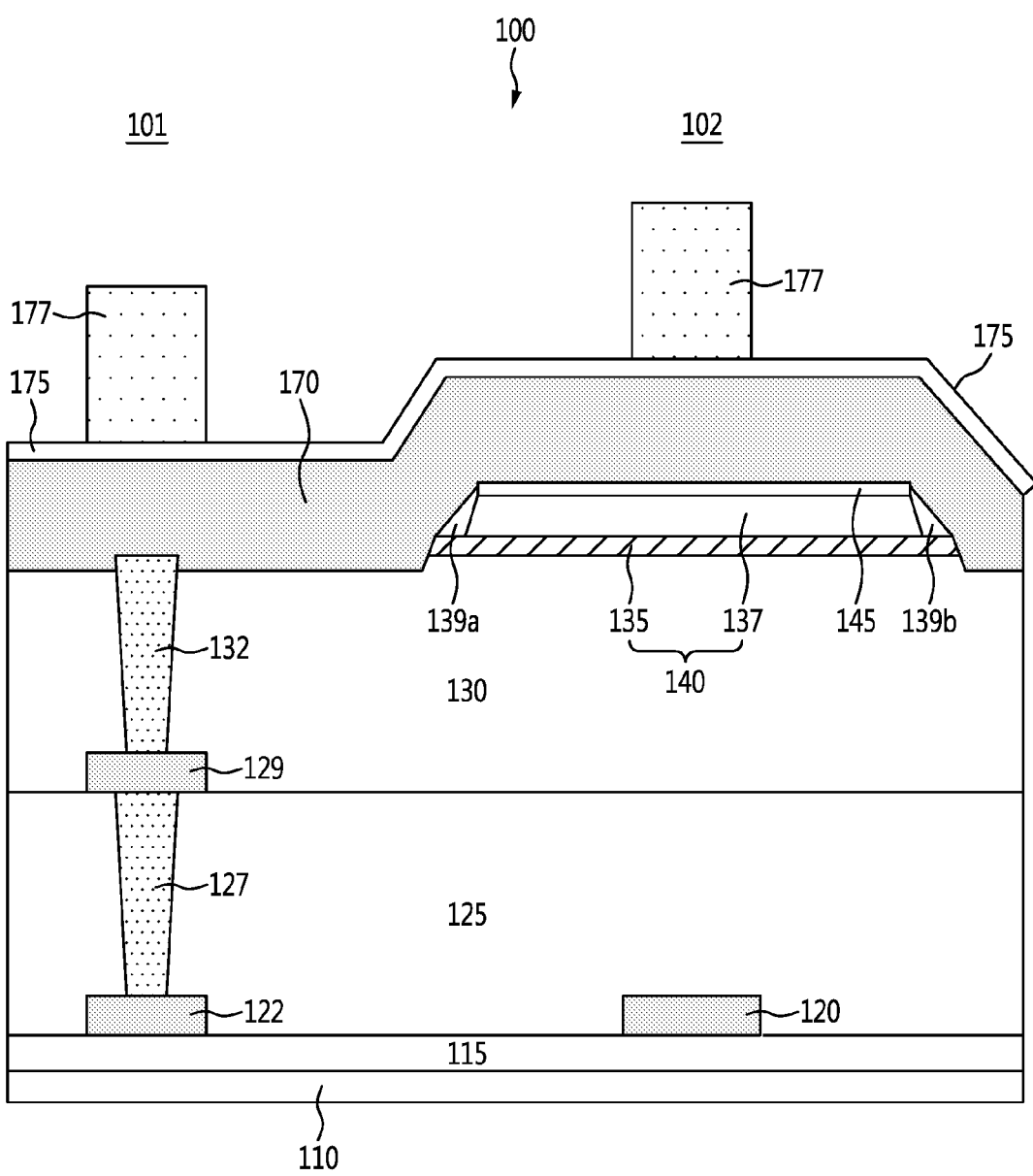

FIG. 6 illustrates a process for forming a thick metal film according to one or more embodiments. Referring to FIG. 6, a thick metal film 170 is formed on the patterned first hard mask layer 145, the exposed second via 132, the spacers 139a and 139b and the patterned low bandgap dielectric layer 140 to form a top electrode and a top metal line. In an example, the thick metal film 170 may be implemented with a material such as Al, Cu, Ti, TiN, W, WN, Ta, or TaN. A second hard mask layer 175 is optionally formed on the thick metal film 170. The second hard mask layer 175 may comprise $SiO_2$, SiN or SiON, etc. A second hard mask layer 175 is advantageous for the etching process margin. Subsequently, a photoresist (PR) pattern 177 is formed on the second hard mask layer 175, and the second hard mask layer 175, the thick metal film 170, the first hard mask layer 145, and the patterned low bandgap dielectric layer 140 are sequentially etched.

Figure 7:
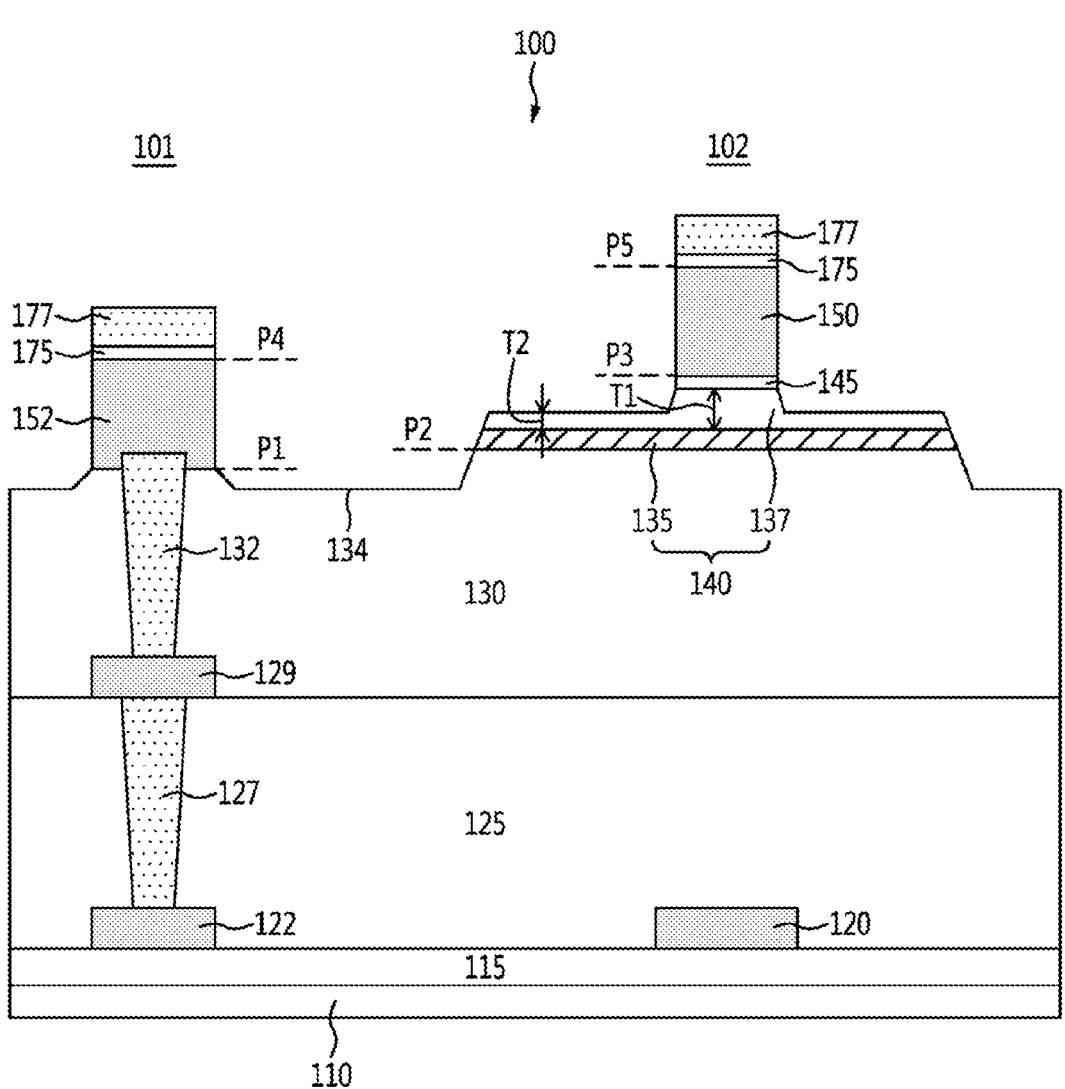

FIG. 7 illustrates a metal etching process to form a top metal line and a top electrode according to one or more embodiments. Referring to FIG. 7, a metal etching process is performed using the PR pattern 177 as a mask pattern. By the metal etching process, a top metal line 152 and a top electrode 150 may be respectively formed in the mixed-signal integrated circuit region 101 and the high-voltage isolation capacitor region 102. That is, the top metal line 152 connected to the second via 132 is formed in the mixed-signal integrated circuit region 101, and the top electrode 150 disposed on the low bandgap dielectric layer 140 is formed in the high-voltage isolation capacitor region 102.

As illustrated in FIG. 7, a portion of the low bandgap dielectric layer 140 may be exposed and further etched during the metal etching process. The patterned second sub-low bandgap dielectric layer 137 may have a first thickness T1 below the top electrode 150. The patterned second sub-low bandgap dielectric layer 137 is partially removed outside the top electrode 150 by the metal etching process. Accordingly, the patterned second sub-low bandgap dielectric layer 137 is further reduced from the first thickness T1 to the second thickness T2.

In an example, the second sub-low bandgap dielectric layer 137 has two different thicknesses. Thus, the patterned low bandgap dielectric layer 140 may also have two different thicknesses. The second thickness T2 of the patterned second sub-low bandgap dielectric layer 140 outside the top electrode 150 is smaller than the first thickness T1 of the low bandgap dielectric layer 140 overlapping the top electrode 150.

As illustrated in FIG. 7, loss of the third inter-metal dielectric layer 130 may occur due to the metal etching process. Therefore, after the metal etching process, the upper surface of the third inter-metal dielectric layer 130 may be lowered. Accordingly, the third inter-metal dielectric layer 130 may have a lowermost surface 134. The lowermost surface 134 formed by the metal etching process may be lower than the lower surface P1 of the top metal line 152 or the lower surface P2 of the first sub-low bandgap dielectric layer 135. Also, the lowermost surface 134 may be lower than the upper surface P2 of the second via 132 by the metal etching process.

As shown in FIG. 7, the low bandgap dielectric layer 140 may have a similar height to the top metal line 152 and may be parallel to the top metal line 152. The bottom surface P3 of the top electrode 150 may be positioned higher than the bottom surface P1 of the top metal line 152. A length of the low bandgap dielectric layer 140 that extends horizontally beyond the top electrode 150 may be greater than a thickness of the top electrode 150. In this case, the patterned second hard mask layer 175 may still remain on the top metal line 152 and the top electrode 150. After the metal etching process, the PR pattern 177 is removed.

Figure 8:
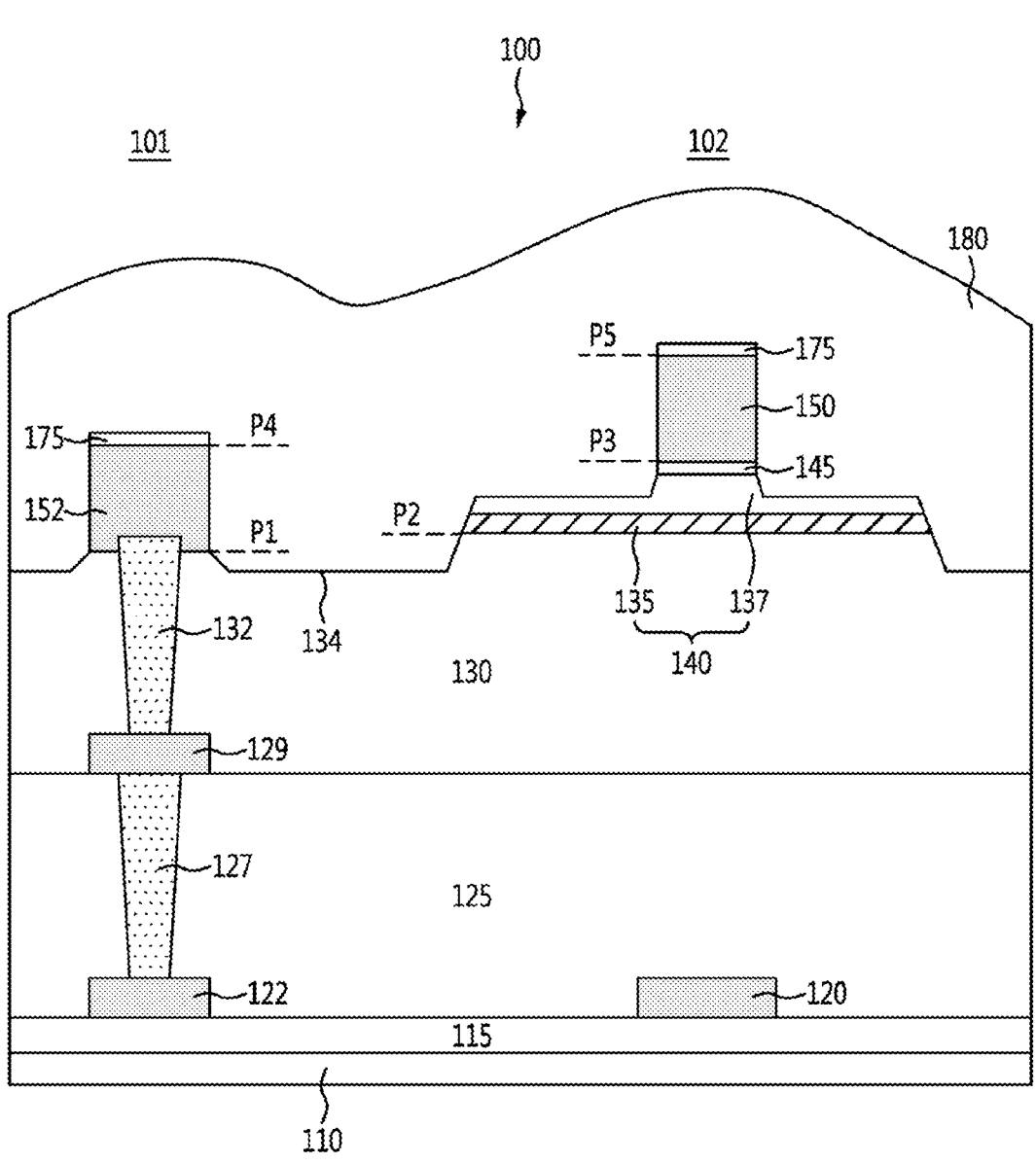

FIG. 8 illustrates a process for depositing a passivation layer on the top metal line and the top electrode according to one or more embodiments. Referring to FIG. 8, a passivation layer 180 is deposited to cover the top metal line 152 and the top electrode 150. The passivation layer 180 is continuously deposited on the mixed-signal integrated circuit region 101 and high-voltage isolation capacitor region 102. The passivation layer 180 may be deposited to contact the top metal line 152 and the top electrode 150. The passivation layer 180 may be formed by stacking $SiO_2$/SiN. Although not illustrated, a patterning process of the passivation layer 180 may be performed to open the pad.

As illustrated in FIG. 8, the low bandgap dielectric layer 140 is not disposed under the top metal line 152 in the mixed-signal integrated circuit region 101. Therefore, the mixed-signal integrated circuit region 101 of the semiconductor device according to one or more embodiments of the present disclosure may reduce leakage current generated in the low bandgap dielectric layer 140. Meanwhile, the low bandgap dielectric layer 140 remains under the top electrode 150 in the high voltage insulating capacitor region 102.

According to the present disclosure as described above, a semiconductor device having a high-voltage isolation capacitor and a method for manufacturing the same according to one or more embodiments of the present disclosure are characterized in that the low bandgap dielectric layer for providing a high-voltage isolation is formed in the high-voltage isolation capacitor region but not disposed in the mixed-signal integrated circuit region.

A number of embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for manufacturing a semiconductor device, the method comprising:

providing a high-voltage isolation capacitor region on a substrate;

forming a bottom electrode in the high-voltage isolation capacitor region;

forming an inter-metal dielectric layer on the bottom electrode;

forming a low bandgap dielectric layer on the inter-metal dielectric layer;

forming a first hard mask layer on the low bandgap dielectric layer;

patterning the first hard mask layer and the low bandgap dielectric layer to form a patterned first hard mask layer and a patterned low bandgap dielectric layer;

depositing a thick metal film on the patterned first hard mask layer and the patterned low bandgap dielectric layer; and patterning the thick metal film to form a top electrode in the high-voltage isolation capacitor region, wherein the top electrode overlaps the patterned first hard mask layer and the patterned low bandgap dielectric layer, and wherein the patterned low bandgap dielectric layer comprises:

a first portion overlapping the top electrode and having a first thickness; and a second portion not overlapping the top electrode and having a second thickness smaller than the first thickness.

2. The method of claim 1, further comprising:

forming a second hard mask layer on the thick metal film; and patterning the second hard mask layer to form a patterned second hard mask layer on the top electrode.

3. The method of claim 1, further comprising:

forming a passivation layer on the patterned low bandgap dielectric layer and the top electrode, such that the passivation layer is in direct contact with the patterned low bandgap dielectric layer and the top electrode.

4. The method of claim 1, wherein the forming of the low bandgap dielectric layer on the inter-metal dielectric layer comprises:

forming a first sub-low bandgap dielectric layer having a first thickness on the inter-metal dielectric layer; and forming a second sub-low bandgap dielectric layer having a second thickness greater than the first thickness on the first sub-low bandgap dielectric layer.

5. The method of claim 1, wherein the low bandgap dielectric layer comprises:

a first sub-low bandgap dielectric layer on the inter-metal dielectric layer; and a second sub-low bandgap dielectric layer on the first sub-low bandgap dielectric layer.

6. The method of claim 1, further comprising:

providing a mixed-signal integrated circuit region adjacent to the high-voltage isolation capacitor region on the substrate, the providing of the mixed-signal integrated circuit region comprising:

forming an inter-metal line and a top via in the mixed-signal integrated circuit region; and forming a top metal line connected to the top via, wherein the low bandgap dielectric layer is not disposed below the top metal line.

7. A method for manufacturing a semiconductor device, the method comprising:

providing a high-voltage isolation capacitor region on a substrate;

forming a bottom electrode in the high-voltage isolation capacitor region;

forming an inter-metal dielectric layer on the bottom electrode;

forming a low bandgap dielectric layer on the inter-metal dielectric layer in the high-voltage isolation capacitor region but not in a mixed-signal integrated circuit region;

forming a first hard mask layer on the low bandgap dielectric layer; and forming a top electrode overlapping the bottom electrode, wherein the top electrode overlaps the first hard mask layer and the low bandgap dielectric layer, wherein the low bandgap dielectric layer comprises a first sub-low bandgap dielectric layer having a first thickness, and a second sub-low bandgap dielectric layer having a second thickness greater than the first thickness, and wherein the second sub-low bandgap dielectric layer comprises a first portion overlapping the top electrode, and a second portion not overlapping the top electrode and having a thickness smaller than a thickness of the first portion.

8. The method of claim 7, further comprising:

forming a second hard mask layer on the top electrode; and forming a passivation layer on the second hard mask layer, wherein the passivation layer is in direct contact with the low bandgap dielectric layer and the top electrode.

9. The method of claim 7, further comprising:

providing the mixed-signal integrated circuit region adjacent to the high-voltage isolation capacitor region on the substrate, the providing of the mixed-signal integrated circuit region comprising:

forming an inter-metal line and a top via in the mixed-signal integrated circuit region; and forming a top metal line connected to the top via, wherein the low bandgap dielectric layer is not disposed below the top metal line.

10. The method of claim 7, further comprising:

forming a spacer insulating layer on the first hard mask layer; and performing an etch-back process on the spacer insulating layer to form spacers on sidewalls of the low bandgap dielectric layer.

11. The method of claim 9, wherein the top electrode has a bottom surface located higher than a bottom surface of the top metal line.

12. The method of claim 7, wherein the low bandgap insulating layer has a bandgap lower than a bandgap of the inter-metal dielectric layer, and wherein the first hard mask layer comprises a metal nitride layer.

13. A method for manufacturing a semiconductor device, the method comprising:

providing a mixed-signal integrated circuit region and a high-voltage isolation capacitor region, respectively, on a substrate;

forming a bottom electrode in the high-voltage isolation capacitor region;

forming an inter-metal dielectric layer on the bottom electrode;

forming an inter-metal line and a top via in the mixed-signal integrated circuit region;

forming a low bandgap dielectric layer on the inter-metal dielectric layer;

forming a first hard mask layer on the low bandgap dielectric layer;

patterning the first hard mask layer and the low bandgap dielectric layer to form a patterned first hard mask layer and a patterned low bandgap dielectric layer;

depositing a thick metal film on the top via, the patterned first hard mask layer, and the patterned low bandgap dielectric layer;

patterning the thick metal film to form a top electrode in the high-voltage isolation capacitor region and a top metal line connected to the top via in the mixed-signal integrated circuit region; and forming a passivation layer on the top metal line, the patterned low bandgap dielectric layer, and the top electrode, wherein the top electrode overlaps the patterned first hard mask layer and the patterned low bandgap dielectric layer, and wherein the low bandgap dielectric layer is not disposed below the top metal line.

14. The method of claim 13, wherein the patterned low bandgap dielectric layer comprises:

a first portion overlapping the top electrode and having a first thickness; and a second portion not overlapping the top electrode and having a second thickness smaller than the first thickness.

15. The method of claim 13, wherein the low bandgap dielectric layer comprises:

a first sub-low bandgap dielectric layer having a first thickness; and a second sub-low bandgap dielectric layer having a second thickness greater than the first thickness.

16. The method of claim 15, wherein the second sub-low bandgap dielectric layer comprises:

a first portion overlapping the top electrode; and a second portion not overlapping the top electrode and having a thickness smaller than a thickness of the first portion.

* * * * *